(12) United States Patent
Berry et al.

(10) Patent No.: US 7,681,169 B2
(45) Date of Patent: Mar. 16, 2010

(54) PROCESS FOR MANAGING COMPLEX PRE-WIRED NET SEGMENTS IN A VLSI DESIGN

(75) Inventors: Christopher J. Berry, Hudson, NY (US); Michael A. Bowen, Wallkill, NY (US); Michael R. Scheuermann, Katonah, NY (US); Michael H. Wood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 11/846,577

(22) Filed: Aug. 29, 2007

(65) Prior Publication Data

US 2009/0064081 A1   Mar. 5, 2009

(51) Int. Cl.
    *G06F 17/50* (2006.01)
(52) U.S. Cl. .......................................... 716/12; 716/15
(58) Field of Classification Search ............... 716/12–15
    See application file for complete search history.

(56) References Cited

U.S. PATENT DOCUMENTS

| | | | |
|---|---|---|---|
| 4,918,614 A | 4/1990 | Modares | |
| 5,548,747 A * | 8/1996 | Rudolph | 716/12 |
| 6,349,403 B1 | 2/2002 | Dutta | |
| 6,477,693 B1 | 11/2002 | Marchenko | |
| 6,543,043 B1 | 4/2003 | Buckley | |
| 6,581,200 B2 | 6/2003 | Chopra | |
| 6,601,227 B1 * | 7/2003 | Trimberger | 716/12 |
| 6,944,842 B1 * | 9/2005 | Trimberger | 716/12 |
| 7,013,449 B2 * | 3/2006 | Schlansker et al. | 716/12 |
| 7,103,863 B2 | 9/2006 | Riepe | |
| 7,146,595 B2 | 12/2006 | Knol | |
| 2005/0097497 A1 | 5/2005 | Schlansker | |

* cited by examiner

Primary Examiner—Jack Chiang
Assistant Examiner—Binh C Tat
(74) Attorney, Agent, or Firm—William A. Kinnaman, Jr.

(57) ABSTRACT

A method for pre-wiring through multiple levels of metal using flues includes steps of: receiving information comprising flue geometries and flue properties; producing multiple routing patterns of a design for the flues; identifying macro instance terminals to be pre-wired in the design; selecting at least one of the routing patterns for the macro instance terminals in the design to avoid blockage; and instantiating the design such that the flues can be manipulated as vias.

15 Claims, 9 Drawing Sheets

200

210 — A user creates a control file that defines the structure and properties of some number of flues.

220 — The control file is parsed, one line in the file for each flue to create

230 — The flue entries for each line in the control file are used to generate the shapes and properties that are the flue.

240 — The shapes generated in the flue are made to be manufacturing legal.

250 — The shapes in the flue are optionally modified to be made compatible with industry standard tools.

260 — The line that came from the file that generated each flue is added to it's flue as a property.

270 — All of the flues defined in the control file now exist as cellViews.

*FIG. 2*

PROCESS FOR MANAGING COMPLEX PRE-WIRED NET SEGMENTS IN A VLSI DESIGN

CROSS-REFERENCE TO RELATED APPLICATIONS

None.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to integrated circuit design and particularly to flue design for integrated circuits.

2. Description of Background

In general, routing programs have difficulty accessing pins when there are not many options for accessing that pin. A problem arises when routing an integrated circuit design with multiple metal layers and at least one level of hierarchy. The problem is that nets with wires on the upper planes of metal need to be able to connect to pins on the lower levels of metal. Subsequently, if there are a lot of pins in a small area and very few tracks available to access those pins a generic router will most likely be unable to access all of the pins. Modern automatic routing applications have trouble connecting to these pins when the wiring resources available above and around the pin are highly restrictive. The solution has been to give the router extra area to route in order to get to the pin. However, it is not always possible or desirable to provide this extra area.

SUMMARY OF THE INVENTION

Briefly, we describe a method for pre-wiring through multiple levels of an element using flues. The method includes steps or acts of: receiving information about the flues, the information including flue geometries and flue properties; producing multiple routing patterns of a pre-wiring design for the flues; identifying macro instance terminals to be pre-wired in the pre-wiring design; selecting at least one of the routing patterns for the macro instance terminals in the pre-wiring design to avoid blockage; and instantiating the pre-wiring design such that the flues can be manipulated as vias. The information can be provided to the method as a data file with each line of the data file representing a single flue. The method further includes a step of parsing each line of the data file.

According to an embodiment of the present invention, a system for fabricating pre-wired net segments includes: an input/output interface configured for receiving information about the net segments; a memory for storing the information; an editor for parsing the information; and a processor configured to: produce a plurality of routing patterns of a design for the net segments; identify macro instance terminals to be pre-wired in the design; and select at least one routing pattern for the macro instance terminals in the design to avoid blockage.

Further, a computer program product embodied on a computer readable medium includes code that, when executed, causes a computer to perform the following: receive information including flue geometries and flue properties; produce multiple routing patterns for a flue design; identify macro instance terminals to be pre-wired in the flue design; and select a routing pattern for the macro instance terminals in the flue design to avoid blockage.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which enables an optimal design for net segments in a VLSI design. The capabilities of the present invention can be implemented in software, firmware, hardware or some combination thereof.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 2 is a lower-level flow chart of the steps for flue creation, according to an embodiment of the present invention;

Figure 1:
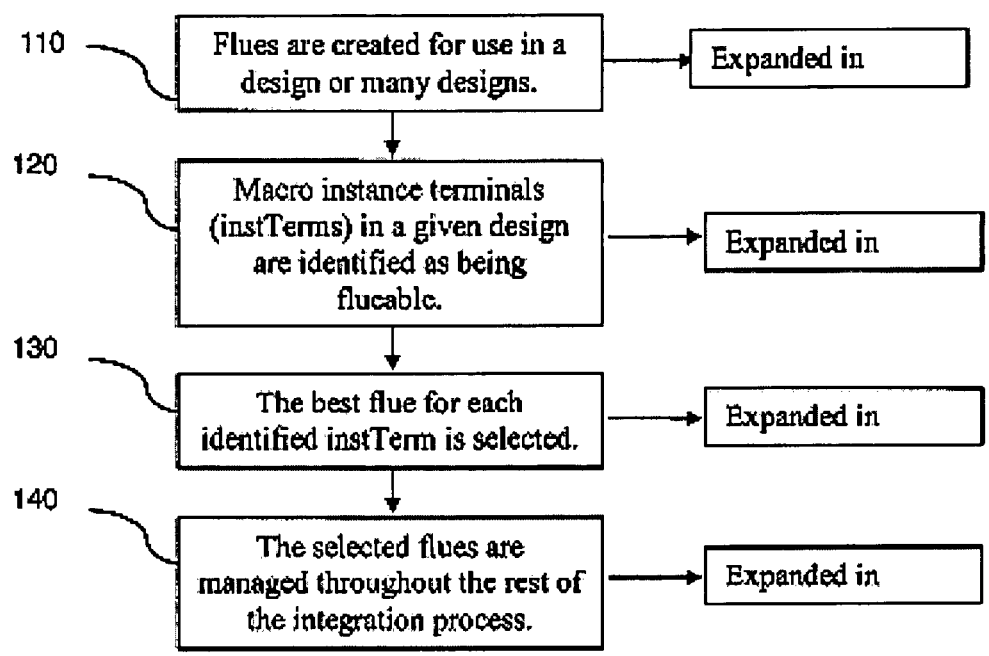
FIG. 1 is a high-level flow chart of the method according to an embodiment of the present invention.

The detailed description explains the preferred embodiments of the invention, together with advantages and features, by way of example with reference to the drawing.

DETAILED DESCRIPTION OF THE INVENTION

We describe a method for facilitating the routing process for interconnect access to pins in a circuit design. The method uses flues to facilitate the interconnect implementation of integrated circuits. Fluing is used for pin access/escape during routing. Using this method, a very efficient prewire can be inserted into a very restrictive blockage pattern, using the least wiring resources possible.

Flues allow a designer to solve the pin access problem in advance by exploring routing patterns and to make high density/low track utilization pin access possible. Flues are relatively complex, predefined sections of interconnects that generally traverse several layers of an interconnect. Flues are new and up to now there is no methodology for managing them.

We begin with some definitions for the terminology used throughout this disclosure:

a cell is a design that can be used inside of another design;

terminals are the input and output connections that design requires for it's functionality;

an instance is the usage of a cell inside of another design;

an instance terminal (also referred to as a pin) is the connection that is made to an instance's terminal;

a flue cell is a cell with wire shapes and via shapes (or instances of vias) that will be used to make a connection from one point to another; and lastly, a netlist is a design of nets defining the interconnection of instance terminals.

The process described herein gives a designer the level of automation required to utilize flues in a VLSI (very large scale integration) design (tens of thousands or more flues in a given design). The designer can then create pin access scenarios that minimize unnecessary track utilization while maintaining a design's routability. The process/automation can take a design that is at different stages in the integration methodology. The basic flow is based around processing a design that has already been prepared for routing. The design is then analyzed and processed so that the new "flued" design is ready for routing.

There are several steps in the basic process. There are also several added steps to improve usability. The set up assumptions are: 1) there are instance with terminals on them in a design developed with fluing in mind; 2) the blockage reservation where those instances are located has been designed with fluing in mind; 3) flues have been designed that can be assigned to those instances' terminals (also known as instTerms) while avoiding the blockage reservation. There are few requisites to this process. The process is preferably used on an integrated circuit that has at least two levels of physical hierarchy. The integrated circuit (herein referred to as the design) must have a proper netlist. A proper netlist, as defined for the scope of this process, is one in which the design has nets that define the connection of instance terminals together. These instance terminals, or pins, must have physical locations and wire layer definitions.

The method may be performed in three phases: 1) prerouting; 2) routing; and 3) post-routing. Referring to FIG. 1 there is shown a high-level flow chart of the main process steps for the three phases, according to an embodiment of the present invention. The process begins at step 110 with the creation of the flues to be used in the design. Flue creation will be detailed in the discussion related to FIG. 2. Next, in step 120 macro instance terminals ("instTerms") in a given design are identified as being flueable. instTerms are discussed with respect to FIG. 3. In step 130 the best flue for each identified instTerm is selected. This selection process will be detailed in FIG. 4. Lastly, in step 140 the selected flues are managed throughout the rest of the integration process. This will be detailed in FIG. 6.

Figure 7:
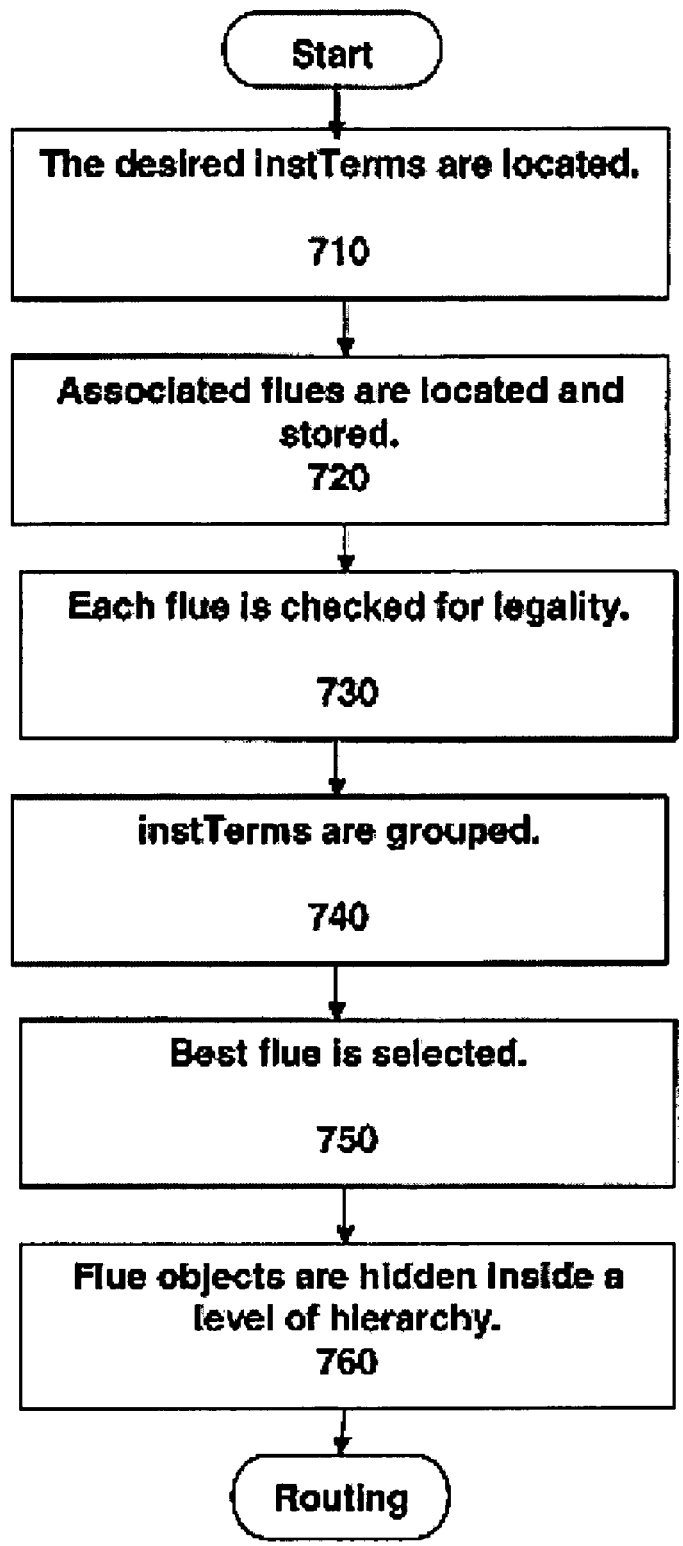
FIG. 7 is a flow chart of the steps for the pre-routing process, according to an embodiment of the present invention.

Referring to FIG. 7 there is shown a high-level flow chart detailing six steps required in the pre-routing process. In step 710 the desired instTerms are located. Next in step 720 the associated flues are located and stored in a data structure. After that in step 730 each flue is checked for legality on each of the instTerms. The list of legal flues for each instTerm is stored on the instTerm. In step 740 instTerms are grouped to prevent flue-to-flue problems. This grouping attempts to ensure that instTerms that are nearby to each other, and whose flues may interact if implemented improperly, don't create illegal situations. Grouping also simplifies the processing to occur later.

Once grouped, in step 750 the best flue is chosen for each instTerm. If the instTerm is in a group the flue is chosen while taking into consideration the solutions for the rest of the group. Lastly in step 760 an abstraction is done to hide the flue objects (unhandled by any router) inside a level of hierarchy. After this the design is routed.

To review this process in more detail, we begin with flue creation. A flue cell can be very simple and contain only a few wires and vias or it can be very complex and contain dozens of wires and vias. The complexity of the flue depends on the requirements of the user and the design requirements. The actual creation of the flue cells is automatic. The user does not need to create any of the flue cells by placing shapes inside of the flue cells at the appropriate location.

Referring to FIG. 2 there is shown a lower-level flow chart 200 of the flue creation process. In one embodiment of the invention, an ASCII control file is used to define the flue cells and an automatic process interprets that file and creates the flue cells. In step 210 a user creates the control file to define the structure and properties of a number of flues; one line of the file corresponds to on flue. The control file may be any data document written in a language that can be parsed. In step 220, the control file is parsed, one line at a time.

In step 230, the flue entries for each line in the control file are used to generate the shapes and properties that define the flue. Next, in step 240 the shapes generated in the flue are made to be manufacturing legal. Optionally, in step 250 the shapes in the flue are further modified to be made compatible with industry standard tools. In step 260 the line from the control file that generated each flue is added to the flue as a property. This will aid in managing the flue for later processing. At the termination of these steps, all of the flues defined in the control file now exist as cell views.

As stated earlier, the description for any given flue is contained in one line of the control file. The description of the flue on a line is basically a tokenized list of strings. The basic format for a line describing a flue is:

cellName flueProperties startLayer "Wire and via descriptions" "Top Layer Definition"

As can be seen in the above line format, the first token is the name to use for the flue cell. The flueProperties token is a colon delimited string whose components describe the flue's type, level, dir, group and rank. The usage of these properties and how they pertain to the rest of the flue process is defined later on in this document. The startLayer token describes on what metal layer the flue is intended to begin. The "Wire and via descriptions" then tell the process the details of the shapes that are to be created inside of the flue. And finally, the "Top Layer Definition" describes the physical attributes of the top level shape.

Below is an example "Wire and via descriptions" section.
1.0 0.5 0.8 VB1_M4 0.9 viaOffset 0.0:0.0 VB2_B1_2x1_W This "Wire and via descriptions" section is a progression of keywords, cellNames, and numbers. These tokens are inspected (parsed) individually from left to right and acted upon accordingly. The ordering of the tokens and the sequence of token types to same or different token types is very important. Each of the different token types has a different function, discussed below:

Keywords—If the token is a keyword then the process is supposed do something special based on the keyword. Some keywords require another token to follow. The different keywords and their functions are described below:

extendMetal—This keyword forces the next metal shape that is created to have the minimum area required.

offset—This keyword needs to have an xy pair following it and changes the current location by the distances in the xy pair.

viaOffset—This keyword is the same as offset, but is specific to the next via that is created.

width—This keyword is followed by a number that indicates the desired width for the metal shapes to follow created on the current layer.

numbers—A token that is a keyword indicates that the process is to create a wire that is the length of the number, on the current layer, oriented in the preferred direction of that layer, that begins at the current location. In integrated circuit design each metal layer has a preferred direction and a non-preferred direction. The preferred direction is the direction used most often for that metal layer. The current location is then updated to the end of the created wire. If numbers occur in sequence, then the process continues to create wires on that layer connecting the current location with the next location. But the directionality of the wire alternates between the preferred direction and the non-preferred direction. A positive number is assumed to go west-to-east, or south-to-north, and a negative number is assumed to go east-to-west, or north-to-south, depending on the direction.

cellNames—If the token is not a keyword and is not a number then it is assumed to be the cellName of a via. The process then inserts the via with that cellName at the current location and changes the current layer to the metal layer above the current layer so that processing transitions to the next metal layer.

Below is an example of a "Top Layer Definitions"
pinOffset 0.0:1.0 pinSize 6.0:0.6

The "Top Layer Definition" is different from the "Wire and via descriptions" in that the sequence of the keywords and keyword/value pairs dots not matter. This is because there is only one top layer, so all of the "Top Layer Definitions" apply.

pinWidth—This keyword is followed by a number that indicates the width of the shape on the top layer. The width is the size of the pin in the non-preferred routing direction for the top layer.

pinLength—This keyword is followed by a number that indicates the length of the shape on the top layer. The length is the size of the pin in the preferred routing direction for the top layer.

pinSize—This keyword is followed by an xy pair that describes the pinLength and pinWidth which behave as if set individually as indicated above.

pinOffset—This keyword is followed by an xy pair and moves the center of the pin away from the current location by the xy amount indicated.

As can be seen, the process is simple: the control file is read one line at a time; each line is parsed; and the described flue cells are created using the description of flue properties and geometries from the line. These flue cells are then used during the rest of the process, as described below.

Figure 3:
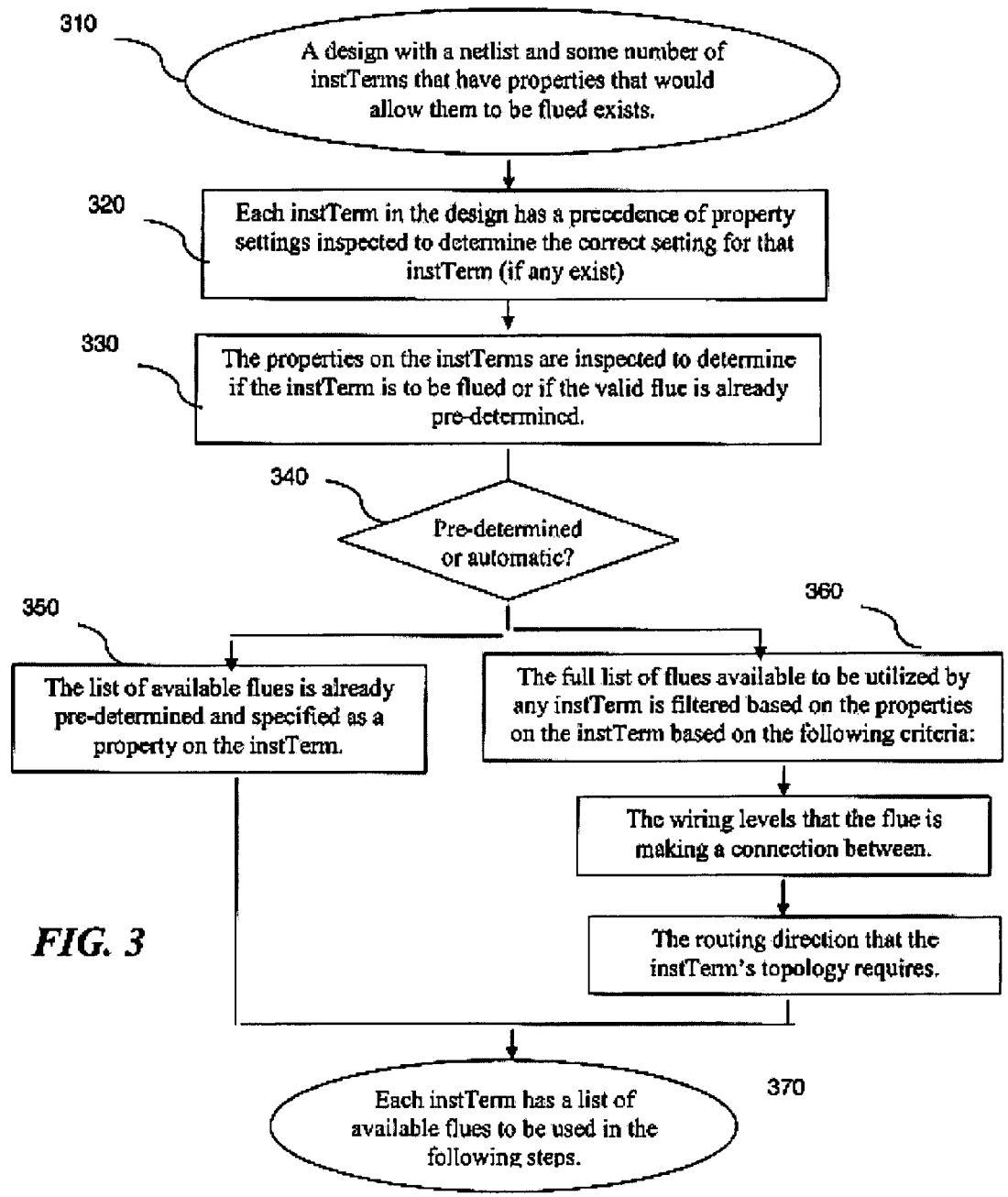
FIG. 3 is a flow chart of the steps for identifying flues for instTerms, according to an embodiment of the present invention.

When the flue creation is complete there will be a number of flue cells produced that will be used and managed by the rest of the process steps. Referring to FIG. 3 there is shown a flow chart of the process steps for identifying instTerms to be used in the design. The input 310 to this stage of the process is a design with a netlist and some number of instTerms that have properties that would allow them to be flued. In step 320 each instTerm in the design is inspected to determine the correct setting for that instTerm (if any exist). In step 330 the properties on the instTerm are inspected to determine if the instTerm is to be flued or if the valid flue is already predetermined.

If in step 340 it is determined that the valid flue is pre-determined, in step 350 the list of available flues is specified as a property on the instTerm. If however, the valid flue is not pre-determined, then in step 360 the full list of flues available to be utilized by any instTerm is filtered based upon the properties on the instTerm. The filtering is based on the following criteria: the wiring levels with which the flue is interconnecting and the routing direction that the instTerm's topology requires. The outputs 370 to this stage of the process are instTerms with a list of available flues to be used in the following steps (further described in FIG. 4).

The next step is to add certain properties onto either the terminals of the cells or onto the instance terminals of the instances in the design. There are a number of properties that can be added to guide or control the automation. The only property that is required for the process to work is the flueOffset property. This property defines the relative placement of the flue with respect to the instance. There are many other properties that can be added to either the terminal or the instance terminal that will control different aspects of the rest of the process:

useFlue—Can be placed on the cell, instance, terminal or instance terminal; will direct the code to not process the cell, instance, terminal, or instance terminal, respectively.

flueDir—Can be placed on either the instance terminal, instance or terminal; and directs the code to choose a flue that is compatible with a direction or set of directions.

flueFix—Can be placed on either the instance terminal, instance or terminal; and directs the code to not re-evaluate the flue that is specified already. It "locks" the selection of the flue for that object for subsequent re-evaluations.

flueLayers—Can be placed on the instance terminal, instance, or terminal and overrides the useLayers specified on, the net that connects to that instance terminal. (useLayers usage will be described later)

flueGroup—Can be placed on the instance terminal, instance or terminal and picks a group, or category, of flue to use.

flueType—Can be placed on the instance terminal, instance or terminal and overrides the direction of the instance terminal when deciding which flue to use. Flue type is not specific to "I," "O," or "B" and can be any letter and would work similar to flueGroup during the flue selection process.

Once the desired properties are on the different objects (instance terminals, instances, terminals, cells and nets) in the design the second part of the automation can begin. There are several main steps that occur that are made up of many smaller steps. Here follows the description of the main steps. These steps can be run individually, as needed, or in one continuous process.

The Remove Overlays step is an optional step. It is required to be run if there are flue overlays in the design and the user would like to have the program re-evaluate flues that are already in the design. This step is necessary because the flue process edits the netlist when it creates the flue overlays; this editing will be described in the "Create Overlays" section.

This part of the process has many smaller steps. But the overall description of it is that it determines which flues can be legally used on each of the instTerms. To begin with it takes a few inputs provided by the user to determine the list of flues for the rest of the process. The user may provide these inputs via a graphical user interface (GUI) or through command line functions. The process also determines what instance terminals (herein referred to as instTerms) it is going to work on.

The process loops through each of the instTerms in the design to determine which of the instTerms are to be processed. For each of the instTerms the process looks to see if there is a useFlue property on the instTerm, the instance, the terminal or the cell. If that property is found in any of those places then that instTerm is not assigned a flue.

Figure 4:
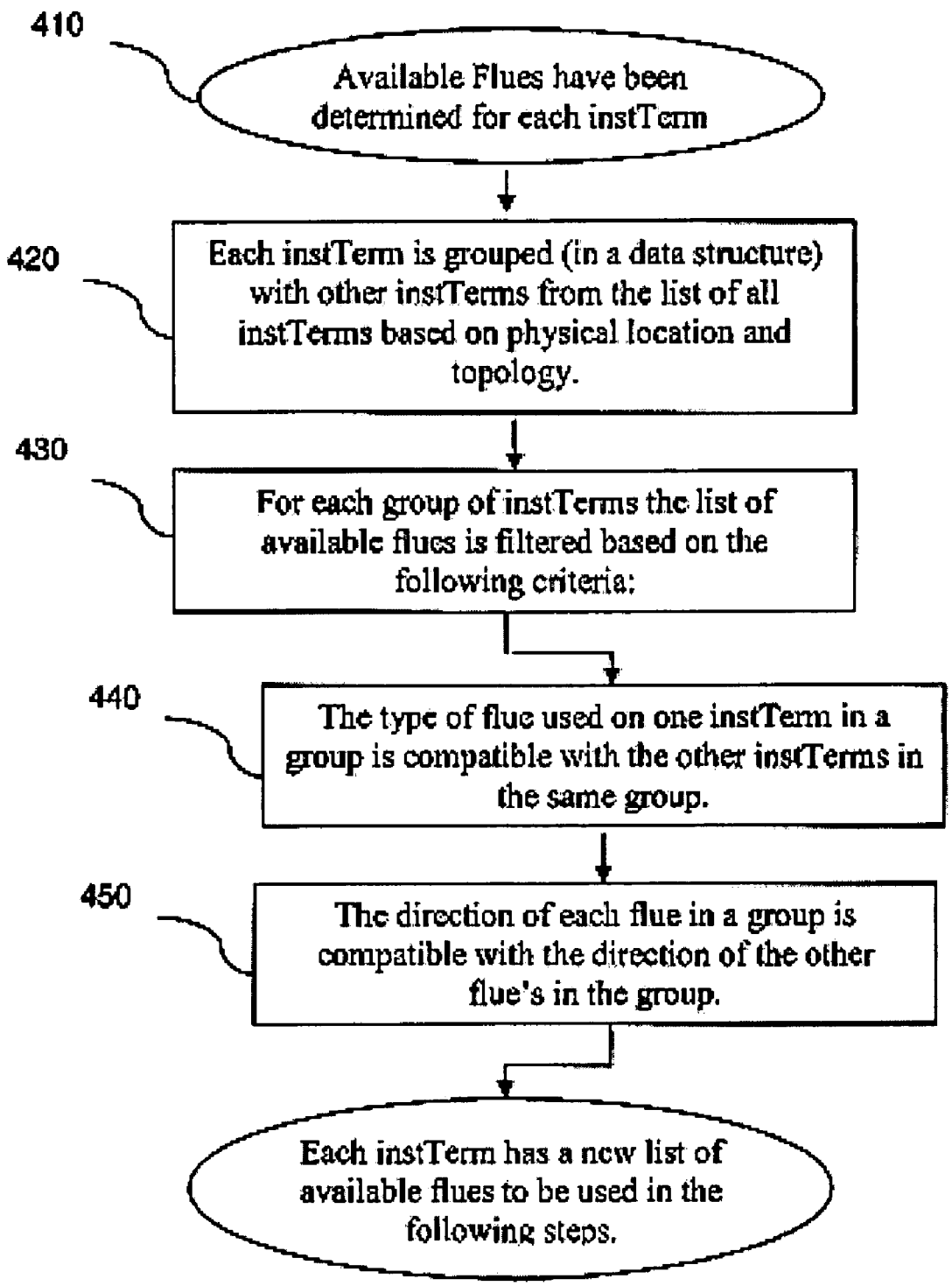
FIG. 4 is a flow chart of the steps for selecting flues, according to an embodiment of the present invention.

Referring to FIG. 4 we proceed to the next stage. The input 410 to this stage is a list of instTerms and the list of flues available. In step 420, we create a data structure that groups the flues based on similar physical structures. The flues generally have many of the same physical structures and by grouping them this way the process only needs to analyze the different physical structures and not each individual flue. In doing this the execution time is significantly reduced, or the designer can pass in many more flue options without significantly increasing the runtime.

In step 430, the process then loops through each of the instTerms and analyzes each of the different physical structures. It looks for the physical configurations that can be legally placed on the instTerm being analyzed. A legal placement is defined as one that does not create any ground rule violations (herein referred to as dre violations) or netlist violations (herein referred to as shorts). Each of the physical configurations that are legal represent a set of flues that are also legal to be placed on the instTerm. This combined list of flues is the valid flue list for the instTerm and the list is added onto the instTerm as a property. The output 430 from this stage is a new list of available flues for each instTerm.

Figure 5:
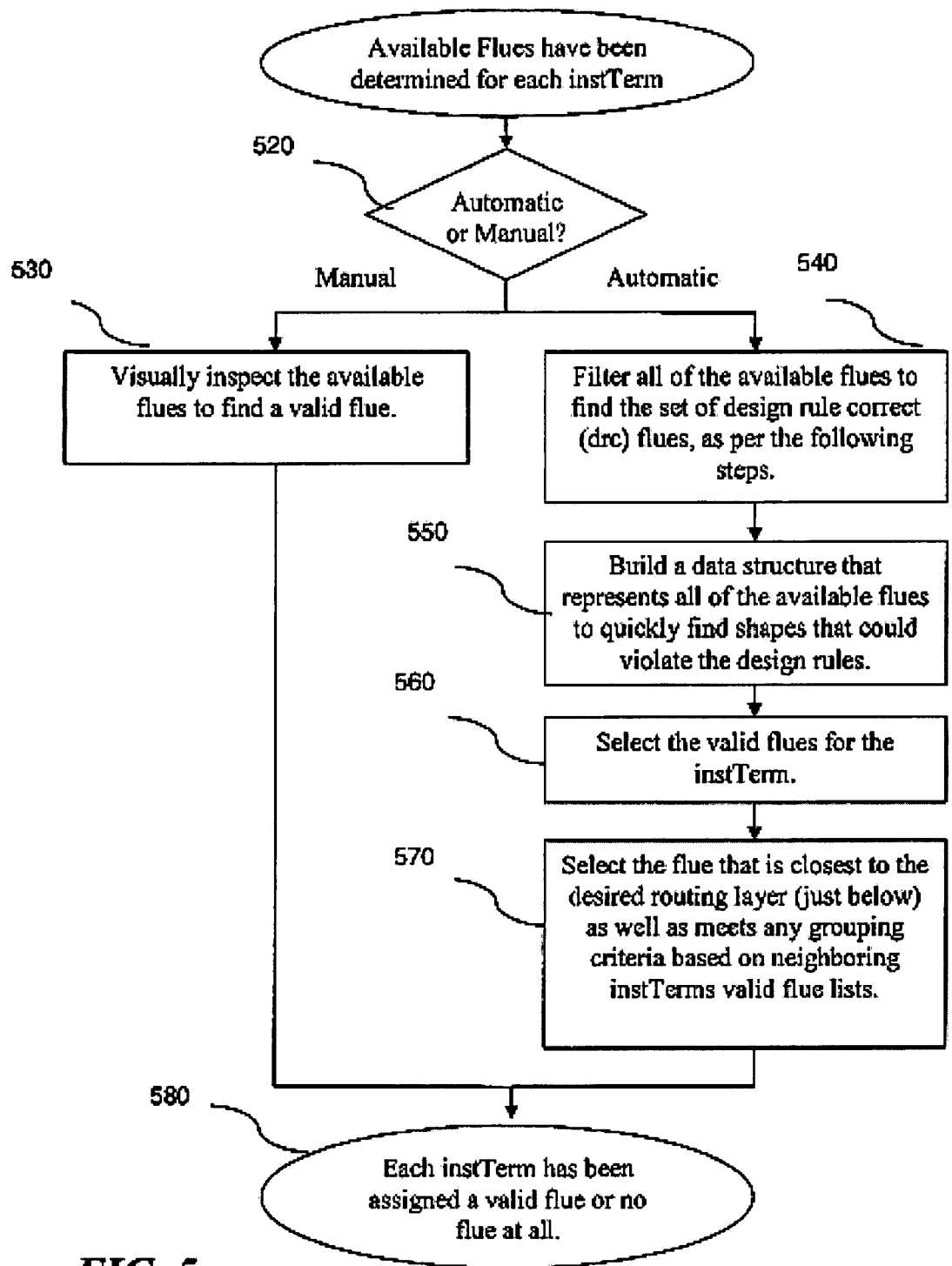
FIG. 5 is a flow chart of the steps for assigning a valid flue to each instTerm, according to an embodiment of the present invention.

Next we set the flue names. This part of the process also has many smaller steps. The basic description of this process is that it takes the list of flue names on each of the instTerms and it determines which flue is best. There are several factors that help determine which flue is best. For each instTerm that has a valid flue list, the process will do the following steps to determine which of those flues is best to use. Refer to the flow chart of FIG. 5. The input 510 to the process is the list of available flues for each instTerm. The process may proceed in one of two routes, automatic or manual. If the manual path is selected, in step 530, a visual inspection will take place to find a valid flue.

In step 540 it will be necessary to look at the net on that instTerm and determine what the general direction that the net will be approaching that instTerm from. That direction can be eider of the four orthogonal directions (East, West, North or South) or a combination of them or all of them. A subset of valid flues is then created comparing the intended flue direction with the desired flue direction. The process will then look at the logical direction of the instTerm, whether it's an input, output, bidi, or user defined. The subsetted list of valid flues is filtered based on the flueType of the flue and the logical direction of the instTerm.

In step 550 a data structure is built that represents all of the available flues from the filtering step 540 to quickly find shapes that could violate the design rules. Those flues are filtered out, leaving an updated list of available flues in step 560. Most of the nets in the design have preferred routing layers specified by a user or by some automated process. Subsequently, many of the instTerms in a design that are intended to be flued are connected to nets that have preferred routing layers. Given that, in step 570 the flue process attempts to use a flue that goes from the pin layer to the layer just below or on the lowest preferred routing layer. The flues that either meet or are closest to the desired layer to layer connection are the ones that are passed forward for selection.

Some of the cells in the design have instTerms that are physically close enough to each other that the flues on those instTerms can interact. An example would be when two instTerms on an instance are close enough such that if the wrong flues are chosen then shorts or dre problems will be created. To prevent this problem flues are created with group identifiers. These group identifiers indicate flues that are compatible with each other when placed in close proximity. Once all of the valid flues lists have been reduced by the previous steps the grouping step is done. The grouping step will first find all of the sets of instTerms whose valid flues have the possibility to interact. Then, for each of the sets of instTerms, the list of valid flues is analyzed for each instTerm in the set. If all the instTerms in the set have compatible groups then only flues from the compatible groups will be assigned. If the instTerms in a set don't have compatible groups then the group that is used by the most instTerms is chosen to be used for the instTerms that have it. The instTerms that don't have that a flue for that group will use possibly non-compatible flues.

Now that the list of valid flues has been reduced to the list that best matches what is desired one of those flues is picked to be used for this instTerm. This is where the "rank" property on the flue comes into play. The flue with the highest "rank" is picked over flues with lower "ranks." If there are multiple flues with the same highest "rank" then the flue to use is randomly picked from that list. If the list of valid flues is empty then the instTerm does not have a flue to use and there isn't one assigned.

Once all of those steps are completed each instTerm that has at least one valid flue still available gets assigned a flue. This is the output 580 from FIG. 5. Assigning that flue is simply putting a property on the instTerm that identifies which flue has been assigned.

Figure 6:
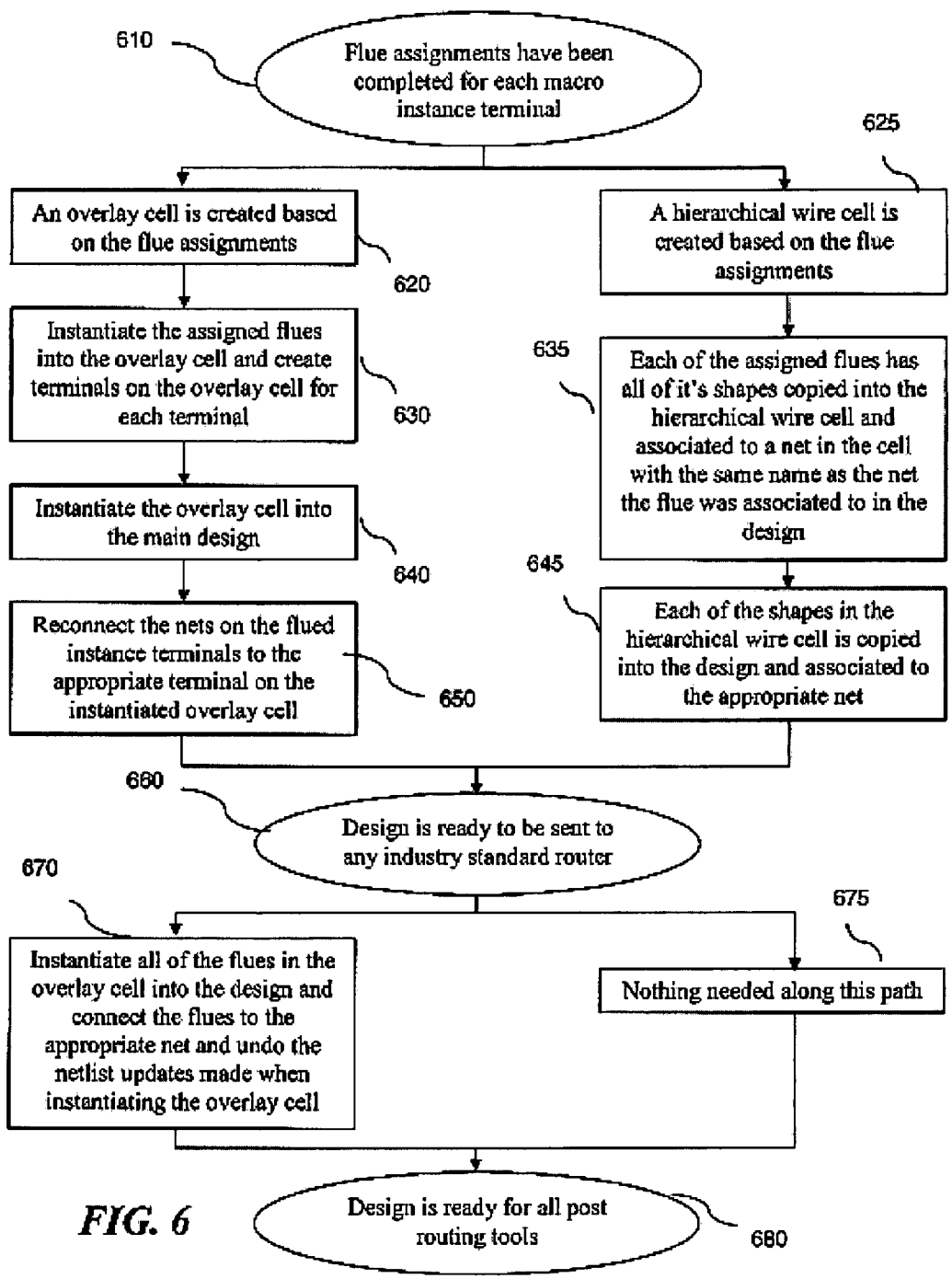
FIG. 6 is a flow chart depicting the steps for the pre-routing and post-routing processes, according to an embodiment of the present invention.

Referring now to FIG. 6, once flue assignments have been completed for instTerm, two different routes are available before taking a flued design to a routing program: Create Overlays and Create Flue Pre-wires. We begin our discussion with the Create Overlays route. In step 620 this process creates a new cellView, an abstracted overlay that represents the intended usage of the flues for each of the instTerms. For this abstracted overlay to work properly it requires that the netlist of the design get edited, each of the original instTerms being flued will be moved to the overlay cell and connected to the top pin of the flue that is created. The user will be required to run the "Flatten Overlays" step once routing is completed to re-create the original instTerms/connections.

In step 630, the cellView overlay cell is instantiated into the current design. For each of the instTerms that are identified the following steps will be run. In step 640, the flue cell that is assigned to the instTerm is instantiated into the overlay cell. A unique logical terminal is created in the overlay cell for this instTerm. In step 640 a pin shape is created in the overlay cell and attached to the terminal. This pin shape is the same size and metal layer as the top metal layer shape in the flue cell. In step 650 the net connected to the instTerm in the design is disconnected from the instTerm and connected to the newly created terminal on the overlay instance. Properties are added to the overlay cell's terminal to facilitate undoing of these connectivity changes.

In step 660, the netlist changes to the design are now completed and the overlay cell is finished. An abstracted version of the overlay cell is created and the abstract replaces the original overlay cell in the design. Abstracting the overlay cell ensures that any routing program will be able to understand the structures inside of the overlay cell.

The other alternative is the Create Flue Pre-wires process. The essence of flues is to solve pin access routing problems that routing programs can't or would have a great deal of difficulty with. The solution can be thought of as a custom routing solution. Traditionally, custom routing solutions are represented with pre-wires. Therefore; we can present our solution as pre-wires to the routing program. There are drawbacks to this approach. In representing the flues as pre-wires to the routing program, there is no way to enforce that the routing program uses the pre-wires to access the instTerms. It generally does use them to access the instTerms, but it is not enforced. Also, some routing programs don't allow the user to specify that prewired segments are not to be updated by the routing program. Therefore some of the prewire segments, or all of them, could be changed or removed by the routing program and subsequently the router may end up being unable to solve the problem. These drawbacks are addressed by the "Create Overlays" part of the process described above.

The "Create Flue Pre-wires" creates routing tool interpretable prewire shapes that match the intention of the assigned flue for each instTerm that a flue was found for. Programmatically this is pretty simple. For each instTerm that has an assigned flue the following steps are performed. In step 625 all of the shapes that are inside of the assigned flue's cell are created in the design at the correct location to represent the intention of the assigned flue. In step 635 each of those shapes is attached to the net that is attached to the instTerm. In step 645 if the desired routing program has the capability to "lock" fig locations then the appropriate properties are added to the shapes to "lock" them in place. There is an option to try to enforce that the routing program connects to the correct shape for each instTerm. To do this a cell is created and instantiated that has routing blockage shapes on all of the prewire segments to which it is not desirable for the router to connect.

In step 660, the design is sent to a routing program. Once the design has gone through either the "Create Flue Pre-wires" or "Create Overlays" steps it is now ready for a routing program. This process has no dependence on a particular routing program. At this point in the process the design is basically in an industry standard routable state.

In the post processing phase, depending on whether the design was run through "Create Flue Pre-wires" or "Create Overlays" determines the type of post processing that is required. If the design had gone through "Create Flue Pre-wires" then very little is required in step 675. The "lock" property on the prewire segments needs to be removed. If the optional blockage overlay cell was created and instantiated then it needs to be removed from the design.

If, however, the design flowed through "Create Overlays" then more is required to be done. In step 670 the overlay cell (or cells) that were created need to be identified in the design. Then for each instTerm on each of the overlay cells in the design the following steps need to be done. The net that connects to the instTerm needs to be reconnected to the instTerm to which it originally connected. The flue that was instantiated in the overlay cell for that terminal needs to be instantiated in the appropriate location in the design. The instantiated flue, or the figures that are inside of the flue, needs to be associated with the net that was connected to the overlay's instTerm. Each of the overlay instances need to be deleted from the design. In step 680 after either of these post processing steps is complete the design now looks just like any other industry standard routed design. The process is now completed.

Figure 8:
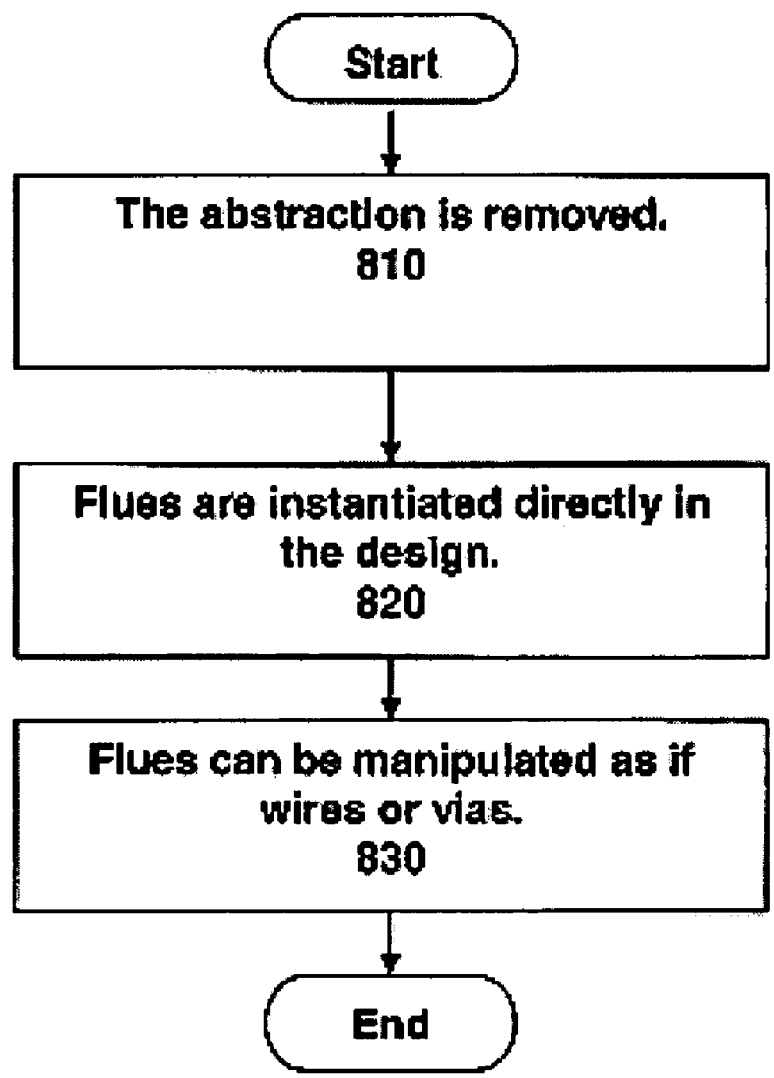
FIG. 8 is a flow chart of the steps for the post-routing process, according to an embodiment of the present invention.

Returning to FIG. 8 there is shown a lower-level flow chart of the post-process steps. After the routing, in the post-routing process, in step 810 the abstraction is removed. Next in step 820 the flues are instantiated directly in the design and in step 830 the flues can be manipulated as if normal wires or vias.

The capabilities of the present invention can be implemented in software, firmware, hardware or some combination thereof.

Figure 9:
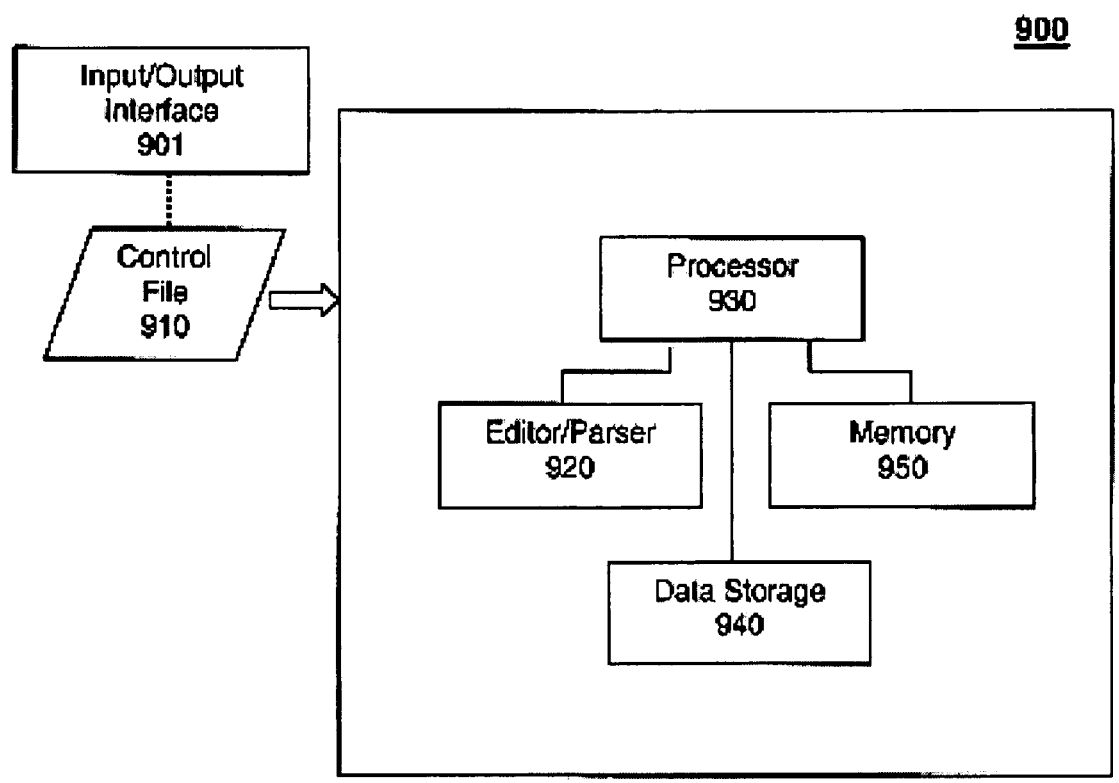
FIG. 9 is a simplified block diagram of a system configured to operate according to an embodiment of the present invention.

Referring to FIG. 9 there is shown a simplified block diagram of a system configured for design of net segments in a VLSI design. The system 900 includes an input/output interface 901 configured for accepting user input regarding the flue design. The user input may be supplied to the system in the form of a data file 910 or a graphical user interface, or another form of user interface, according to the parameters of the system 900.

The system 900 further includes an editor/parser 920 for manipulating the data file 910 in order to extract the data required by the process; a processor 930 for carrying out the design steps; storage 940, and memory 950.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method for pre-wiring comprising steps of:

using an input/output interface for receiving information about a plurality of flues that traverse a plurality of layers of an interconnect, the information comprising a data file specifying flue geometries and flue properties, said data file comprising lines wherein each line of the data file represents a single flue;

using a parser to execute a step of parsing each line of the data file for information on the single flue;

using a data storage device for storing the line comprising the flue geometries and properties of the flue;

using a processor device for generating the flues using the flue geometries and the flue properties; and using the processor device for:

producing data structures that group the flues based on similar physical structures;

producing a plurality of routing patterns for a pre-wiring net design for the flues using the data structures, wherein said pre-wiring net design comprises nets that define connections of instance terminals, wherein said instance terminals comprise physical locations and wire layer definitions;

identifying the instance terminals to be pre-wired in the pre-wiring net design;

identifying a list of the flues for each identified instance terminal;

checking each identified flue for legality on its associated instance terminal, producing an updated list of available flues;

grouping the instance terminals to prevent flue-to-flue problems;

identifying an optimal flue for each instance terminal from the updated list of available flues, taking into consideration other instance terminals in the group;

selecting the routing patterns for the macro instance terminals with the optimal flue in the pre-wiring net design to avoid blockage; and instantiating the pre-wiring net design using the selected routing pattern such that the flues are manipulated as vias for the macro instance terminals through multiple levels of the interconnect.

2. The method of claim 1 wherein producing multiple routing patterns further comprises converting the flue geometries and flue properties to shapes and database properties associated with the flues.

3. The method of claim 2 further comprising a step of modifying the flue geometries to create manufacturing legal shapes compatible with industry standard routing tools.

4. The method of claim 1 further comprising storing a preferred routing direction for the flue in the flue property.

5. The method of claim 1 wherein the grouping step further comprises grouping the flues based on their physical location and topology.

6. The method of claim 1 wherein the selecting step further comprises defining a property to force usage of a particular routing pattern.

7. The method of claim 1 wherein the selecting step comprises using placement of a pin to drive flue selection of nearby pins.

8. The method of claim 1 wherein the selecting step further comprises filtering all available flues on a pin based on pin design rules.

9. The method of claim 1 further comprising steps of:
abstracting the flues into a level of hierarchy; and
attaching the flues to terminals of the level of hierarchy,
before the instantiating step.

10. The method of claim 9 wherein the instantiating step comprises instantiating an overlay cellView into the design and updating a netlist of the design.

11. The method of claim 9 further comprising placing shapes comprising the flues into a hierarchical wire cell and assigning them to a net within the hierarchical wire cell that has a same name as the net in the design.

12. A system for fabricating pre-wired net segments, the system comprising:
an input/output interface configured for receiving net segment information comprising a data file specifying flue geometries and flue properties, said data file comprising lines wherein each line of the data file represents a single flue;
a memory for storing the net segment information;
an editor for parsing the net segment information by parsing each line of the data file;
a processor configured to:
produce data structures that group the flues based on similar physical structures;
produce a plurality of routing patterns of a design for the net segments using the data structures, wherein said net segments define connections of instance terminals, wherein said instance terminals comprise physical locations and wire layer definitions;
identify macro instance terminals to be pre-wired in the design;
identify a list of the flues for each identified macro instance terminal;
check each identified flue for legality on its associated macro instance terminal to produce an updated list of available flues;
identify an optimal flue for each instance terminal from the updated list of available flues; and
select the routing pattern with the optimal flue for the macro instance terminals in the design to avoid blockage.

13. The system of claim 12 wherein the input/output interface comprises a graphical user interface and the information is received using the graphical user interface.

14. A computer program product embodied on a computer readable storage medium and comprising code that, when executed, causes a computer to perform the following:
receive information about a plurality of flues that traverse a plurality of layers of an interconnect, said information comprising a data file specifying flue geometries and flue properties, said data file comprising lines wherein each line of the data represents a single flue;
produce data structures that group the flues based on similar physical structures;
produce a plurality of routing patterns for a flue design using the data structures, wherein said flue design comprises nets that define connections of macro instance terminals, wherein said instance terminals comprise physical locations and wire layer definitions;
identify the macro instance terminals to be pre-wired in the flue design;
identify a list of the flues for each identified instance terminal;
check each identified flue for legality on its associated instance terminal producing an updated list of available flues;
identifying an optimal flue for each instance terminal from the updated list of available flues; and
select a routing pattern for the macro instance terminals with the optimal flue in the flue design to avoid blockage.

15. The computer readable medium of claim 14 wherein the code, when executed, further causes a processor to convert the flue geometries and flue properties to shapes and database properties associated with the flue such that the flue design is instantiated and the flues manipulated as vias.

* * * * *